United States Patent
Yeh et al.

(10) Patent No.: US 8,159,302 B2
(45) Date of Patent: Apr. 17, 2012

(54) DIFFERENTIAL AMPLIFIER CIRCUIT

(75) Inventors: Sung-Yau Yeh, Hsinchu County (TW); Kuo-Jen Hsu, Hsinchu County (TW)

(73) Assignee: ILI Technology Corporation, Jhubei (TW)

( * ) Notice: Subject to any disclaimer, the term of this patent is extended or adjusted under 35 U.S.C. 154(b) by 0 days.

(21) Appl. No.: 12/975,824

(22) Filed: Dec. 22, 2010

(65) Prior Publication Data
US 2012/0044021 A1 Feb. 23, 2012

(30) Foreign Application Priority Data
Aug. 20, 2010 (TW) ................. 99127936 A

(51) Int. Cl.
*H03F 3/45* (2006.01)
(52) U.S. Cl. ...................... 330/257; 330/255
(58) Field of Classification Search .................. 330/253, 330/255, 257
See application file for complete search history.

(56) References Cited

U.S. PATENT DOCUMENTS

| | | | | |
|---|---|---|---|---|
| 6,392,485 B1 * | 5/2002 | Doi et al. | ...................... | 330/253 |
| 7,102,436 B2 * | 9/2006 | Sung | .............................. | 330/255 |

* cited by examiner

*Primary Examiner* — Khanh Nguyen
(74) *Attorney, Agent, or Firm* — Steptoe & Johnson LLP

(57) ABSTRACT

A differential amplifier circuit includes: P-type and N-type differential input units outputting respectively first and second outputs in response to first and second input voltages; a P-type current mirror circuit driven by the second output; an N-type current mirror circuit driven by the first output; an output unit outputting an output voltage in response to control outputs from the P-type and N-type current mirror circuits; a first sub-current source including first and second P-type transistors connected in series; and a second sub-current source including first and second N-type transistors connected in series. Control ends of the second P-type and second N-type transistors receive the control outputs from the P-type and N-type current mirror circuits, respectively. Control ends of the first P-type and first N-type transistors are coupled to a common node between the first and second P-type transistors, and a common node between the first and second N-type transistors, respectively.

11 Claims, 5 Drawing Sheets

DIFFERENTIAL AMPLIFIER CIRCUIT

CROSS-REFERENCE TO RELATED APPLICATION

This application claims priority of Taiwanese Application No. 099127936, filed on Aug. 20, 2010.

BACKGROUND OF THE INVENTION

1. Field of the Invention

The invention relates to a differential amplifier circuit, and more particularly to a differential amplifier circuit with a high slew rate.

2. Description of the Related Art

FIG. 1 illustrates a conventional differential amplifier circuit capable of reducing current consumption and proposed in U.S. Pat. No. 6,392,485. In FIG. 1, since the conventional differential amplifier circuit has a reduced steady-state current, charging and discharging speeds of the capacitors (C1, C2) are limited, and variations of gate voltages of the transistors (M15, M16) are limited. Thus, a slew rate of the output voltage (Vout) is limited. Therefore, when variations of the gate voltages of the transistors (M15, M16) are detected respectively by the transistors (M18, M19), the transistors (M18, M19) are turned on to provide a temporary-state current such that the capacitors (C1, C2) receive the temporary-state and steady-state currents to raise the charging and discharging speeds, thereby enhancing the slew rate of the output voltage (Vout).

However, when the gate-source voltage or the source-gate voltage of the transistors (M15, M16) in the steady state is greater than a threshold voltage, the transistors (M18, M19) are turned on. As a result, the differential amplifier circuit has an increased steady-state current, thereby increasing power consumption.

SUMMARY OF THE INVENTION

Therefore, an object of the present invention is to provide a differential amplifier circuit that can overcome the aforesaid drawbacks of the prior art.

According to the present invention, a differential amplifier circuit comprises:

a P-type differential input unit having a non-inverted input end adapted for receiving a first input voltage, and an inverted input end adapted for receiving a second input voltage, the P-type differential input unit outputting a first output in response to the first and second input voltages;

an N-type differential input unit having a non-inverted input end adapted for receiving the first input voltage, and an inverted input end adapted for receiving the second input voltage, the N-type differential input unit outputting a second output in response to the first and second input voltages;

a P-type current mirror circuit coupled to the N-type differential input unit for receiving the second output therefrom, and driven by the second output to generate a first control output;

an N-type current mirror circuit coupled to the P-type differential input unit for receiving the first output therefrom, and driven by the first output to generate a second control output;

an output unit coupled to the P-type and N-type current mirror circuits for receiving the first and second control outputs therefrom, and outputting an output voltage in response to the first and second control outputs from the P-type and N-type current mirror circuits;

a first sub-current source including first and second P-type transistors connected in series, the first P-type transistor having a control end coupled to a common node between the first and second P-type transistors, the second P-type transistor having a control end receiving the first control output from the P-type current mirror circuit such that the second P-type transistor is driven by the first control output from the P-type current mirror circuit; and a second sub-current source including first and second N-type transistors connected in series, the first N-type transistor having a control end coupled to a common node between the first and second N-type transistors, the second N-type transistor having a control end receiving the second control output from the N-type current mirror circuit such that the second N-type transistor is driven by the second control output from the N-type current mirror circuit.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
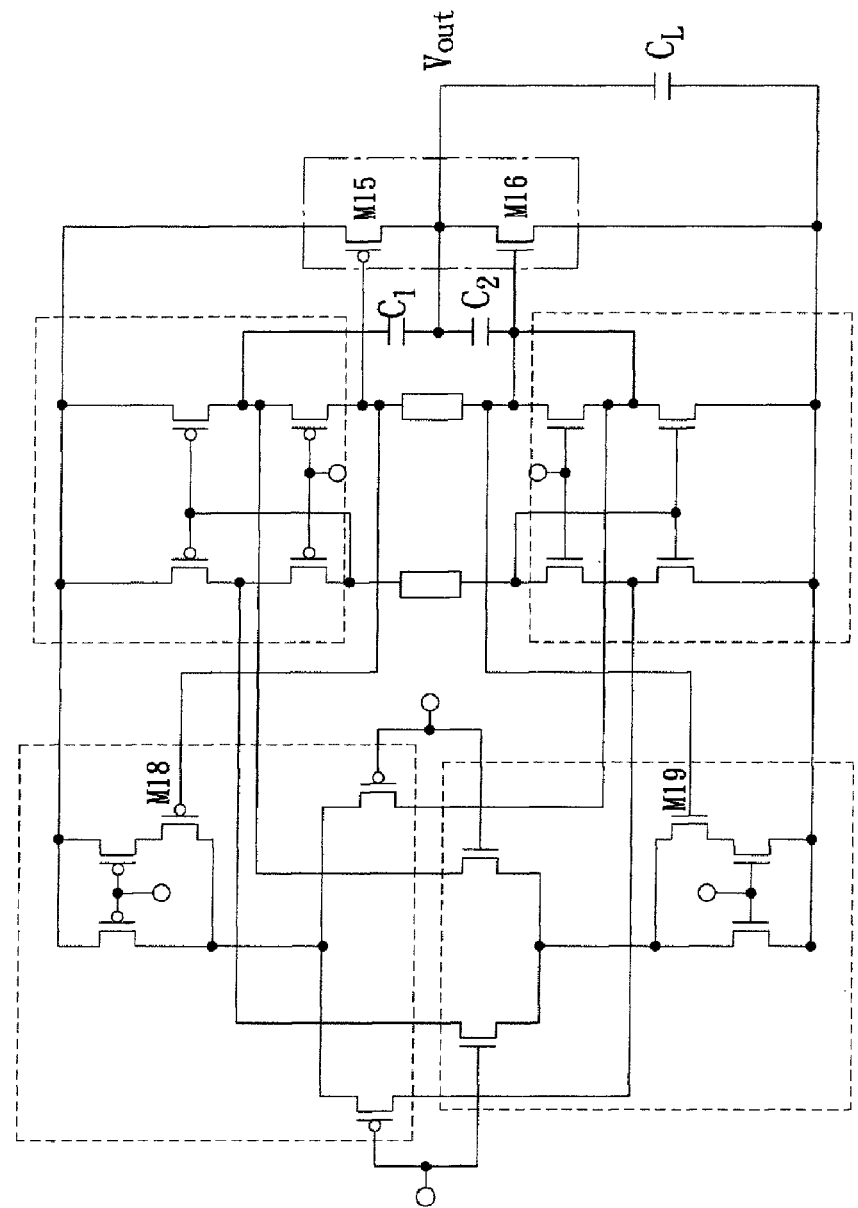
FIG. 1 is a schematic electrical circuit diagram illustrating a conventional differential amplifier circuit.

Before the present invention is described in greater detail, it should be noted that like elements are denoted by the same reference numerals throughout the disclosure.

Figure 2:
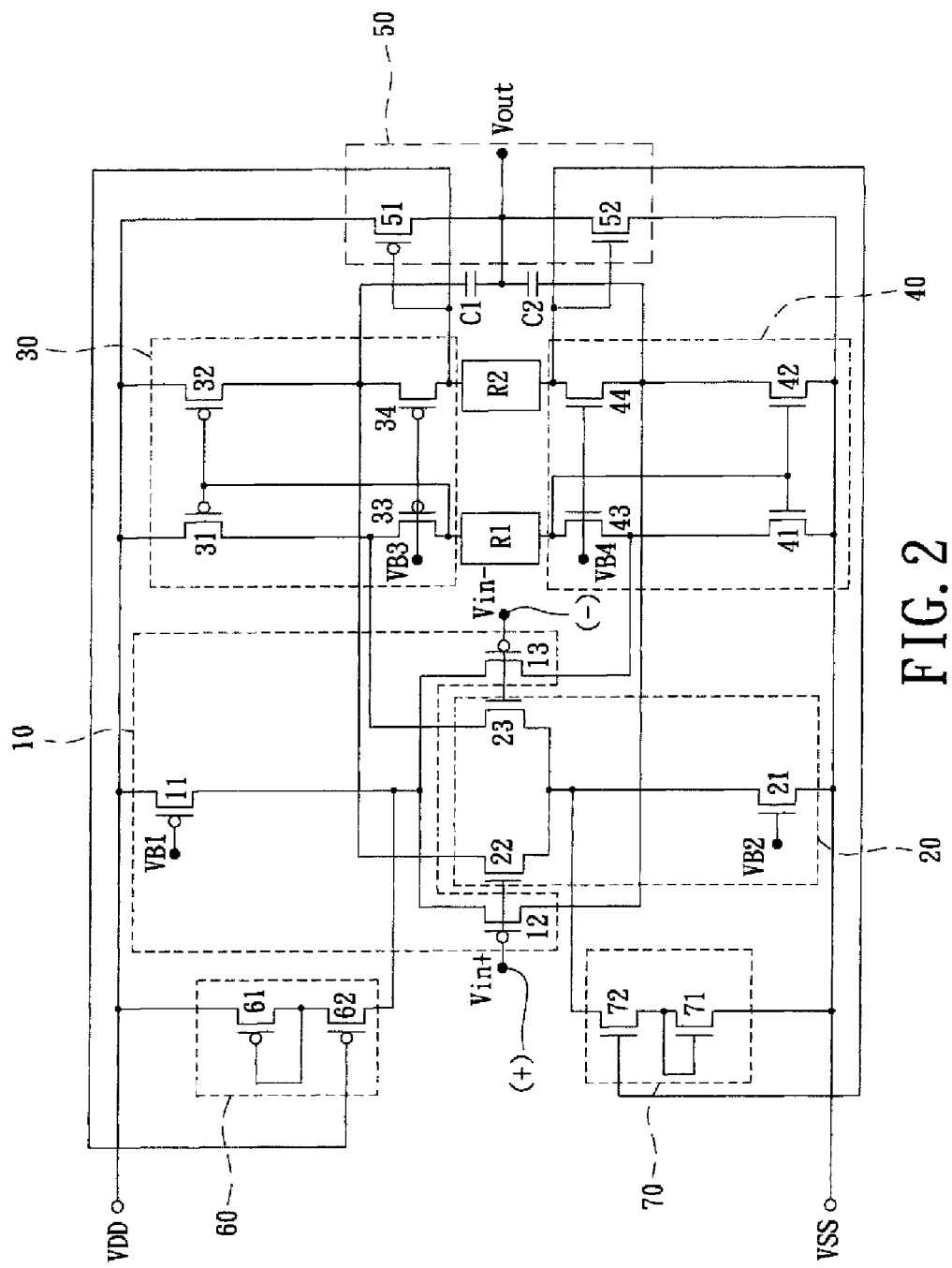
FIG. 2 is a schematic electrical circuit diagram illustrating the first preferred embodiment of a differential amplifier circuit according to the present invention.

Referring to FIG. 2, the first preferred embodiment of a differential amplifier circuit according to the present invention is shown to include a P-type differential input unit 10, an N-type differential input unit 20, a P-type current mirror circuit 30, an N-type current mirror circuit 40, a first capacitor (C1), a second capacitor (C2), a first resistor (R1), a second resistor (R2), an output unit 50, a first sub-current source 60, and a second sub-current source 70.

The P-type differential input unit 10 has a non-inverted input end (+) adapted for receiving a first input voltage (Vin+), and an inverted input end (−) adapted for receiving a second input voltage (Vin−). The P-type differential input unit 10 outputs a first output in response to the first and second input voltages (Vin+, Vin−). In this embodiment, the P-type differential input unit 10 includes first, second and third PMOS transistors 11, 12, 13. The first PMOS transistor 11 has a source adapted for receiving a positive power voltage (VDD), a gate adapted for receiving a first bias voltage (VB1), and a drain coupled to sources of the second and third PMOS transistor 12, 13. Gates of said second and third PMOS transistors 12, 13 are coupled respectively to the non-inverted end (+) and the inverted input end (−). The first output is output at drains of the second and third PMOS transistors 12, 13.

The N-type differential input unit 20 has the same non-inverted input end (+) and inverted input end (−). The N-type differential input unit 20 outputs a second output in response to the first and second input voltages (Vin+, Vin−). In this embodiment, the N-type differential input unit 20 includes first, second and third NMOS transistors 21, 22, 23. The first NMOS transistor 21 has a source adapted for receiving a negative power voltage (VSS), a gate adapted for receiving a second bias voltage (VB2), and a drain coupled to sources of the second and third NMOS transistors 22, 23. Gates of said second and third NMOS transistors 22, 23 are coupled respectively to the non-inverted end (+) and the inverted input end (−). The second output is output at drains of the second and third NMOS transistors 22, 23.

The first and second capacitors (C1, C2) are connected in series between the drain of the second NMOS transistor 22 of the N-type differential input unit 20 and the drain of the second PMOS transistor 12 of the P-type differential input unit 10.

The P-type current mirror circuit 30 is coupled to the N-type differential input 20 for receiving the first output therefrom, and is driven by the second output to generate a first control output. In this embodiment, the P-type current mirror circuit 30 is composed of four PMOS transistors 31, 32, 33, 34, wherein sources of the transistors 31, 32 are adapted to receive the positive power voltage (VDD), and gates of the transistors 33, 34 are adapted to receive a third bias voltage (VB3).

The N-type current mirror circuit 40 is coupled to the P-type differential input 10 for receiving the second output therefrom, and is driven by the first output to generate a second control output. In this embodiment, the N-type current mirror circuit 40 is composed of four NMOS transistors 41, 42, 43, 44, wherein sources of the transistors 41, 42 are adapted to receive the negative power voltage (VSS), and the gates of the transistors 43, 44 are adapted to receive a fourth bias voltage (VB4).

The first and second resistors (R1, R2) are coupled between the P-type current mirror circuit 30 and the N-type current mirror circuit 40, wherein the first resistor (R1) is coupled between drains of the transistors 33, 43, and the second resistor (R2) is coupled between drains of the transistors 34, 44.

The output unit 50 is coupled to the P-type and N-type current mirror circuits 30, 40 for receiving the first and second control outputs therefrom, and outputs an output voltage (Vout) in response to the first and second control outputs from the P-type and N-type current mirror circuits 30, 40. The output voltage (Vout) is adapted to be applied to an external load capacitor (not shown). In this embodiment, the output unit 50 includes P-type and N-type output transistors 51, 52 connected in series. The P-type output transistor 51 has a control end coupled to the drain of the transistor 34 of the P-type current mirror circuit 30 for receiving the first control output from the P-type current mirror circuit 30 such that the P-type output transistor 51 is driven by the first control output from the P-type current mirror circuit 30. The N-type output transistor 52 has a control end coupled to the drain of the transistor 44 of the N-type current mirror circuit 40 for receiving the second control output from the N-type current mirror circuit 40 such that the N-type output transistor 52 is driven by the second control output from the N-type current mirror circuit 40. The output voltage (Vout) is output at a common node between the P-type and the N-type output transistors 51, 52.

In this embodiment, the first sub-current source 60 is coupled in parallel to the first PMOS transistor 11 of the P-type differential input unit 10, and includes first and second P-type transistors 61, 62, such as PMOS transistors, connected in series. The first P-type transistor 61 has a source adapted to receive the positive power voltage (VDD), and has a control end, i.e., a gate, coupled to a common node between the first and second P-type transistors 61, 62. The second P-type transistor 62 has a control end, i.e., a gate, receiving the first control output from the P-type current mirror circuit 30 such that the second P-type transistor 62 is driven by the first control output from the P-type current mirror circuit 30.

In this embodiment, the second sub-current source 70 is coupled in parallel to the first NMOS transistor 21 of the N-type differential input unit 20, and includes first and second N-type transistors 71, 72, such as NMOS transistors, connected in series. The first N-type transistor 71 is adapted to receive the negative power voltage (VSS) at a source thereof, and has a control end, i.e., a gate, coupled to a common node between the first and second N-type transistors 71, 72. The second N-type transistor 72 has a control end, i.e., a gate, receiving the second control output from the N-type current mirror circuit 40 such that the second N-type transistor 72 is driven by the second control output from the N-type current mirror circuit 40.

When the source-gate voltage ($V_{SG}$) of the P-type output transistor 51 is greater than twice a threshold voltage (Vth), the second P-type transistor 62 is turned on. When the gate-source voltage ($V_{GS}$) of the N-type output transistor 52 is greater than twice the threshold voltage (Vth), the second N-type transistor 72 is turned on. Compared to the prior art, the second P-type transistor 62 and the second N-type transistor 72 are more difficult to turn on. Therefore, when the differential amplifier circuit is in a steady state, where the first input voltage (Vin+) is equal to the second input voltage (Vin−), the second P-type transistor 62 and the second N-type transistor 72 remain cut off, thereby decreasing steady-state current consumption.

When the differential amplifier circuit changes from the steady state to a state, where the first input voltage (Vin+) is greater than the second input voltage (Vin−), most of a tail current of the first PMOS transistor 11 flows through the third PMOS transistor 13 and the transistor 41 to increase the current flowing through the transistor 41. Thus, the N-type current mirror circuit 40 increases currents flowing through the transistors 42, 44 to reduce the second control output. As a result, the current flowing through the N-type output transistor 52 of the output unit 50 also decreases, which may cause the N-type output transistor 52 to cut off. In addition, most of a current flowing through the first NMOS transistor 21 flows through the second NMOS transistor 22 to reduce the current flowing through the transistor 34, thereby reducing the first control output. As a result, the current flowing through the P-type output transistor 51 increases to charge the external load capacitor to raise the output voltage (Vout) until the differential amplifier circuit reaches steady state. Furthermore, in this state, the first and second control outputs reduce quickly to rapidly charge the external load capacitor, thereby rapidly raising the output voltage (Vout). Therefore, the slew rate of the output voltage (Vout) is improved.

Similarly, when the differential amplifier circuit changes from the steady state to a state, where the first input voltage (Vin+) is less than the second input voltage (Vin−), the first control output rises to decrease the current flowing through the P-type output transistor 51. In addition, the second control output also rises to increase the current flowing through the N-type output transistor 52. Accordingly, the external load capacitor discharges to lower the output voltage (Vout) until the differential amplifier circuit comes into the steady state.

Furthermore, in this state, the first and second control outputs rise quickly to rapidly discharge the external load capacitor, thereby rapidly lowering the output voltage (Vout). Therefore, the slew rate of the output voltage (Vout) is improved.

In this manner, variation of the first and second input voltage (Vin+, Vin−) can be detected based on the first and second control outputs. After the differential amplifier circuit reaches steady state, the second P-type transistor 62 of the first sub-current source 60 and the second P-type transistor 72 of the second sub-current source 70 are effectively turned off to decrease steady-state current consumption.

Figure 3:
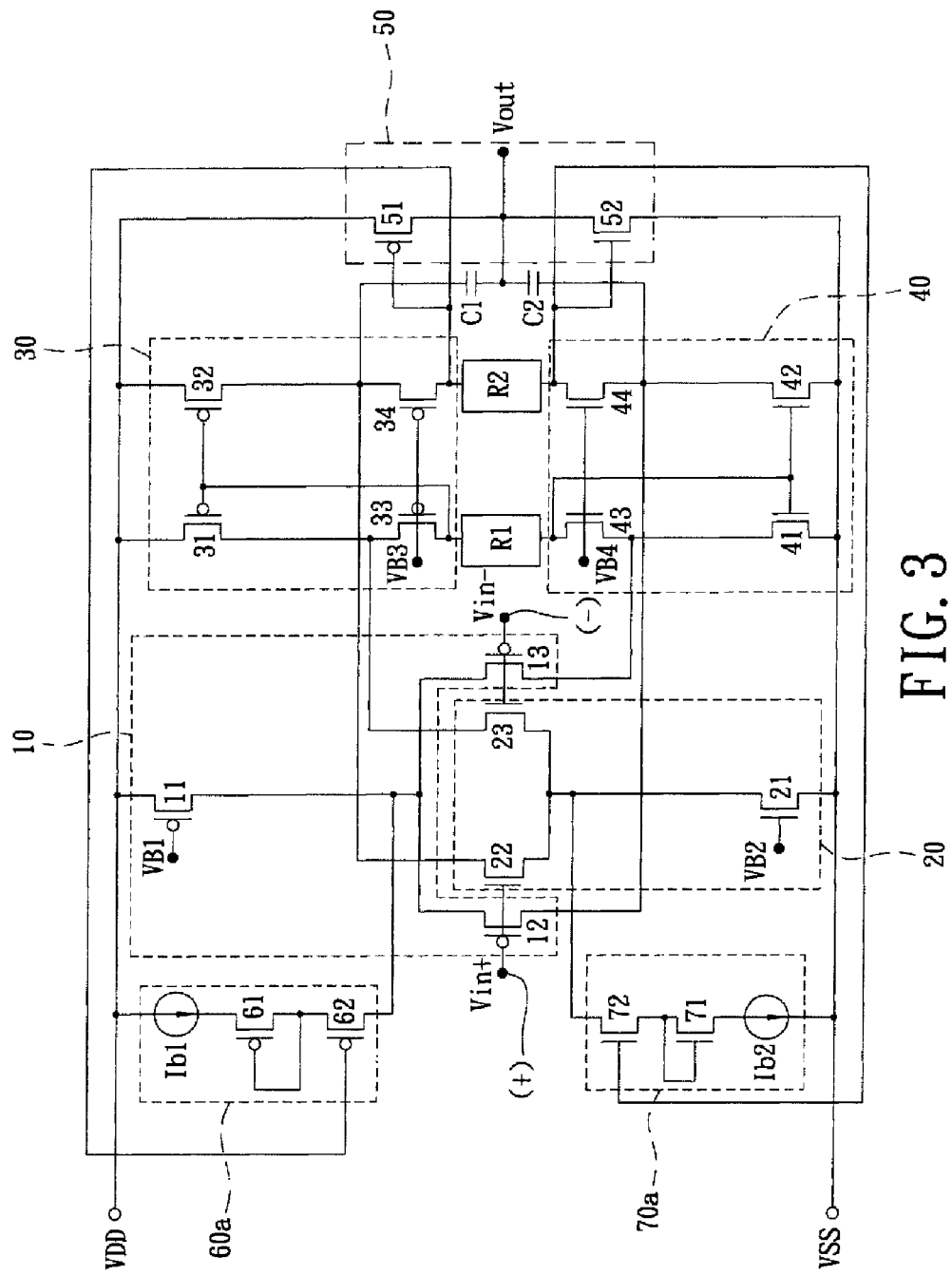
FIG. 3 is a schematic electrical circuit diagram illustrating the second preferred embodiment of a differential amplifier circuit according to the present invention.

FIG. 3 illustrates the second preferred embodiment of a differential amplifier circuit according to this invention, which is a modification of the first preferred embodiment. The second preferred embodiment differs from the first preferred embodiment in that the first sub-current source (60a) further includes a first constant current source (Ib1) coupled between the first PMOS transistor 11 of the P-type differential input unit 10 and the first P-type transistor 61. In addition, the second sub-current source (70a) further includes a second constant current (Ib2) coupled between the first NMOS transistor 21 of the N-type differential input unit 20 and the first N-type transistor 71.

Figure 4:
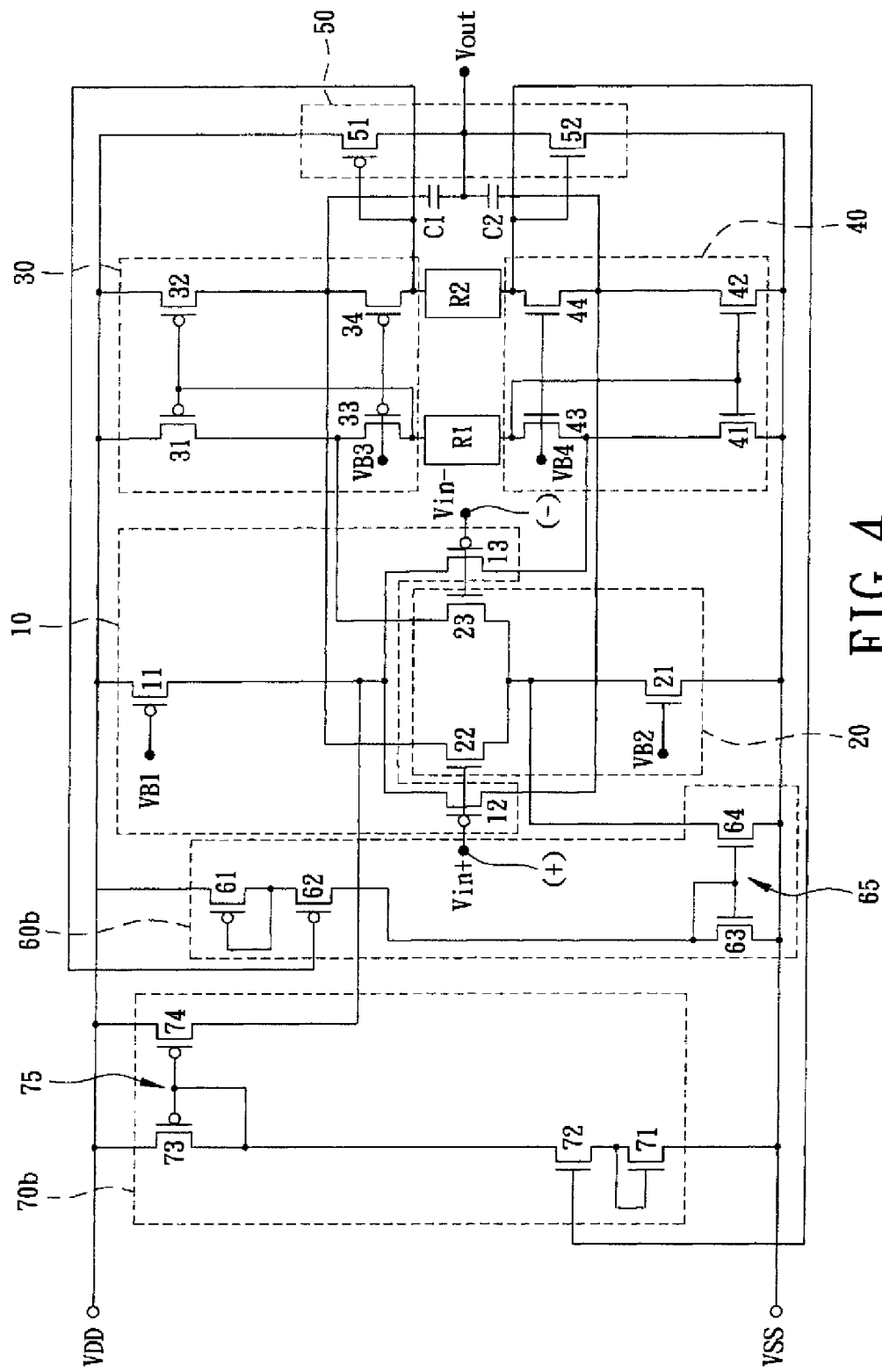
FIG. 4 is a schematic electrical circuit diagram illustrating the third preferred embodiment of a differential amplifier circuit according to the present invention.

FIG. 4 illustrates the third preferred embodiment of a differential amplifier circuit according to this invention, which is a modification of the first preferred embodiment. In this embodiment, the first sub-current source (60b) includes the first and second P-type transistors 61, 62, and an N-type sub-current mirror 65 coupled to the second P-type transistor 62, and a common node among the first, second and third NMOS transistors 21, 22, 23 of the N-type differential input unit 20. The N-type sub-current mirror 65 includes a first NMOS transistor 63 connected in series to the second P-type transistor 62, and a second NMOS transistor 64 connected in parallel to the first NMOS transistor 21 of the N-type differential input unit 20. Gates of the first and second NMOS transistors 63, 64 are coupled to a drain of the first NMOS transistor 63.

In addition, the second sub-current source (70b) includes the first and second N-type transistors 71, 72, and a P-type sub-current mirror 75 coupled to the second N-type transistor 72 and a common node among the first, second and third PMOS transistors 11, 12, 13 of the P-type differential input unit 10. The P-type sub-current mirror 75 includes a first PMOS transistor 73 connected in series to the second N-type transistor 72, and a second PMOS transistor 74 connected in parallel to the first PMOS transistor 11 of the P-type differential input unit 10. Gates of the first and second PMOS transistors 73, 74 are coupled to a drain of the first PMOS transistor 73.

In such a configuration, when the first and second input voltages (Vin+, Vin−) varies, the N-type and P-type sub-current mirrors 65, 75 cause the currents flowing through the third PMOS transistor 13 of the third PMOS transistor 13 and the third NMOS transistor 23 to increase, which results in rapid variation of the first and second control outputs. Thus, the slew rate of the output voltage (Vout) is improved.

Figure 5:
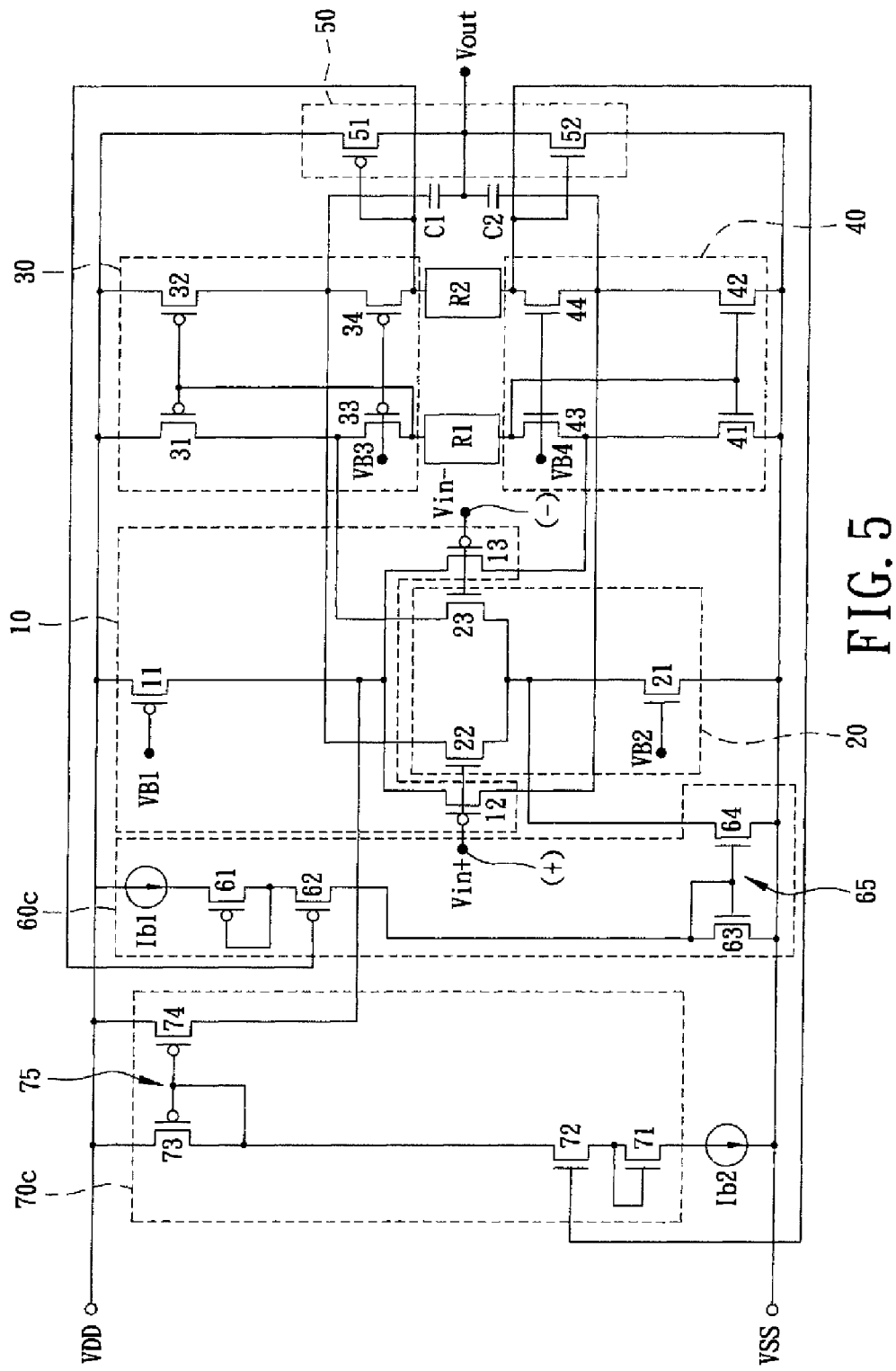
FIG. 5 is a schematic electrical circuit diagram illustrating the fourth preferred embodiment of a differential amplifier circuit according to the present invention.

FIG. 5 illustrates the fourth preferred embodiment of a differential amplifier circuit according to this invention, which is a modification of the third preferred embodiment. As compared to the third preferred embodiment, the first sub-current source (60c) further includes the first constant sub-current source (Ib1) in the second preferred embodiment, and the second sub-current source (70c) further includes the second constant sub-current source (Ib2) in the second preferred embodiment.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A differential amplifier circuit comprising:
   a P-type differential input unit having a non-inverted input end adapted for receiving a first input voltage, and an inverted input end adapted for receiving a second input voltage, said P-type differential input unit outputting a first output in response to the first and second input voltages;
   an N-type differential input unit having a non-inverted input end adapted for receiving the first input voltage, and an inverted input end adapted for receiving the second input voltage, said N-type differential input unit outputting a second output in response to the first and second input voltages;
   a P-type current mirror circuit coupled to said N-type differential input unit for receiving the second output therefrom, and driven by the second output to generate a first control output;
   an N-type current mirror circuit coupled to said P-type differential input unit for receiving the first output therefrom, and driven by the first output to generate a second control output;
   an output unit coupled to said P-type and N-type current mirror circuits for receiving the first and second control outputs therefrom, and outputting an output voltage in response to the first and second control outputs from said P-type and N-type current mirror circuits;
   a first sub-current source including first and second P-type transistors connected in series, said first P-type transistor having a control end coupled to a common node between said first and second P-type transistors, said second P-type transistor having a control end receiving the first control output from said P-type current mirror circuit such that said second P-type transistor is driven by the first control output from said P-type current mirror circuit; and
   a second sub-current source including first and second N-type transistors connected in series, said first N-type transistor having a control end coupled to a common node between said first and second N-type transistors, said second N-type transistor having a control end receiving the second control output from said N-type current mirror circuit such that said second N-type transistor is driven by the second control output from said N-type current mirror circuit.

2. The differential amplifier circuit as claimed in claim 1, wherein said output unit includes P-type and N-type output transistors connected in series, said P-type output transistor having a control end for receiving the first control output from said P-type current mirror circuit such that said P-type output transistor is driven by the first control output from said P-type current mirror circuit, said N-type output transistors having a control end for receiving the second control output from said N-type current mirror circuit such that said N-type output transistor is driven by the second control output from said N-type current mirror circuit, the output voltage being output at a common node between said P-type and N-type output transistors.

3. The differential amplifier circuit as claimed in claim 1, further comprising first ands second resistors coupled between said P-type and N-type current mirror circuits.

4. The differential amplifier circuit as claimed in claim 3, wherein:
said P-type differential input unit includes first, second and third PMOS transistors, a gate of said first PMOS transistor being adapted for receiving a first bias voltage, a drain of said first PMOS transistor being coupled to sources of said second and third PMOS transistors, gates of said second and third PMOS transistors being coupled respectively to said non-inverted and inverted input ends of said P-type differential input unit, the first output being output at drains of said second and third PMOS transistors; and
said N-type differential input unit includes first, second and third NMOS transistors, a gate of said first PMOS transistor being adapted for receiving a second bias voltage, a drain of said first NMOS transistor being coupled to sources of said second and third NMOS transistors, gates of said second and third NMOS transistors being coupled respectively to said non-inverted and inverted input ends of said N-type differential input unit, the second output being output at drains of said second and third NMOS transistors.

5. The differential amplifier circuit as claimed in claim 4, further comprising first and second capacitors connected in series between said drain of said second NMOS transistor of said N-type differential input unit and said drain of said second PMOS transistor of said P-type differential input unit.

6. The differential amplifier circuit as claimed in claim 4, wherein:
said first sub-current source is connected in parallel to said first PMOS transistor of said P-type differential input unit; and
said second sub-current source is connected in parallel to said first NMOS transistor of said N-type differential input unit.

7. The differential amplifier circuit as claimed in claim 6, wherein:
said first sub-current source further includes a first constant current source coupled between said first PMOS transistor of said P-type differential input unit and said first P-type transistor; and
said second sub-current source further includes a second constant current source coupled between said first NMOS transistor of said N-type differential input unit and said first N-type transistor.

8. The differential amplifier circuit as claimed in claim 4, wherein:
said first sub-current source further includes an N-type sub-current mirror coupled to said second P-type transistor, and a common node among said first, second and third NMOS transistors of said N-type differential input unit; and
said second sub-current source further includes a P-type sub-current mirror coupled to said second N-type transistor, and a common node among said first, second and third PMOS transistors of said P-type differential input unit.

9. The differential amplifier circuit as claimed in claim 8, wherein:
said first sub-current source further includes a first constant current source coupled between said first PMOS transistor of said P-type differential input unit and said first P-type transistor; and
said second sub-current source further includes a second constant current source coupled between said first NMOS transistor of said N-type differential input unit and said first N-type transistor.

10. The differential amplifier circuit as claimed in claim 8, wherein:
said N-type sub-current mirror of said first sub-current source includes a first NMOS transistor connected in series to said second P-type transistor, and a second NMOS transistor connected in parallel to said first NMOS transistor of said N-type differential input unit, gates of said first and second NMOS transistors of said N-type sub-current mirror being coupled to a drain of said first NMOS transistor of said N-type sub-current mirror; and
said P-type sub-current mirror of said second sub-current source includes a first PMOS transistor connected in series to said second N-type transistor, and a second PMOS transistor connected in parallel to said first PMOS transistor of said P-type differential input unit, gates of said first and second PMOS transistors of said P-type sub-current mirror being coupled to a drain of said first PMOS transistor of said P-type sub-current mirror.

11. The differential amplifier circuit as claimed in claim 1, wherein:
each of said first and second P-type transistors of said first sub-current source is a PMOS transistor that has a gate serving as said control end; and
each of said first and second N-type transistors of said second sub-current source is an NMOS transistor that has a gate serving as said control end.

* * * * *